(12) United States Patent
Arvin et al.

(10) Patent No.: US 9,177,928 B1
(45) Date of Patent: Nov. 3, 2015

(54) CONTACT AND SOLDER BALL INTERCONNECT

(71) Applicant: INTERNATIONAL BUSINESS MACHINES CORPORATION, Armonk, NY (US)

(72) Inventors: Charles L. Arvin, Poughkeepsie, NY (US); Eric D. Perfecto, Poughkeepsie, NY (US); Wolfgang Sauter, Vail, CO (US)

(73) Assignee: GlobalFoundries, Grand Cayman (KY)

( * ) Notice: Subject to any disclaimer, the term of this patent is extended or adjusted under 35 U.S.C. 154(b) by 0 days.

(21) Appl. No.: 14/260,399

(22) Filed: Apr. 24, 2014

(51) Int. Cl.
*H01L 21/44* (2006.01)
*H01L 23/00* (2006.01)

(52) U.S. Cl.
CPC ......... *H01L 24/11* (2013.01); *H01L 2224/1183* (2013.01); *H01L 2924/014* (2013.01); *H01L 2924/0105* (2013.01); *H01L 2924/0132* (2013.01)

(58) Field of Classification Search
CPC ................. H01L 21/4825; H01L 21/28079; H01L 21/67069; H01L 21/67063; H01L 21/28088; H01L 21/76877; H01L 23/4951; H01L 23/488; H01L 23/345; H01L 23/49531
USPC ......... 438/612, 613, 614, 687, 685, 680, 637, 438/648, 672, 663, 675, 706, 745, 712; 257/E21.006, E21.023, E21.007, 257/E21.082, E21.126, E21.127, E21.165, 257/E21.218, E21.229, E21.267, E21.499, 257/E21.508, E21.509, 17
See application file for complete search history.

(56) References Cited

U.S. PATENT DOCUMENTS

| | | | |
|---|---|---|---|
| 8,637,392 B2 * | 1/2014 | Arvin et al. | 438/614 |
| 2004/0130034 A1 * | 7/2004 | Alvarez | 257/762 |
| 2006/0087034 A1 * | 4/2006 | Huang et al. | 257/737 |
| 2007/0020912 A1 * | 1/2007 | Nishiyama et al. | 438/613 |
| 2008/0048320 A1 * | 2/2008 | Lee et al. | 257/737 |
| 2009/0149016 A1 * | 6/2009 | Park et al. | 438/614 |

* cited by examiner

*Primary Examiner* — David Nhu
(74) *Attorney, Agent, or Firm* — Matthew C. Zehrer

(57) ABSTRACT

A semiconductor device fabrication method includes forming a barrier layer upon a dielectric layer, forming a pillar interconnect structure upon the barrier layer, forming solder upon the pillar interconnect structure, reflowing the solder to release solder voids, forming a perimeter material around at least a portion of an exposed sidewall of the pillar, and removing the barrier layer exterior to the pillar interconnect structure. Another fabrication method includes forming the barrier layer, forming the pillar interconnect structure, forming the solder upon the pillar interconnect structure, forming a perimeter material on exposed surfaces of the pillar interconnect structure, and removing the barrier layer on the surface of the dielectric layer exterior to the pillar interconnect structure. Another fabrication method includes forming the barrier layer, forming the pillar interconnect structure, forming a wettable material on sidewalls of the pillar, and removing the barrier layer exterior to the pillar interconnect structure.

20 Claims, 9 Drawing Sheets

US 9,177,928 B1

CONTACT AND SOLDER BALL INTERCONNECT

FIELD

Embodiments of invention generally relate to semiconductor devices, design structures for designing a semiconductor device, and semiconductor device fabrication methods. More particularly, embodiments relate to a contact (e.g. pillar, receiving pad, etc.) and solder ball interconnect for semiconductor chip-to-package applications.

BACKGROUND

A pillar is a semiconductor chip-to-package interconnect technology. The advantages in the pillars lie in the extendibility to finer pitch and the superior electromigration (EM) performance compared to conventional solder C4's (controlled collapse chip connection). The pillar may be made from copper and provides the enhanced EM performance but increases the die stress for chip-to-chip and chip-to-wafer joints (i.e., 3D applications). The finer pitch is due to its vertical sidewall.

In copper pillar technology, a small amount of solder is still required to connect the copper pillars on the chips to the pad on the substrate. Sometimes the solder may wet the sidewall of the pillar. In some applications pillar sidewall wetting may be beneficial. For example, in implementations where solder is attached a receiving pad of a substrate or carrier, the pillar may include wettable sidewalls to ensure adequate electrical connection between the chip and package. However, in other applications sidewall wetting is undesired. For example, referring to FIG. 1A and FIG. 1B a conventional copper pillar structure with wettable sidewall is shown. Here, the solder will flow onto the sidewall of the copper pillars. This can cause bridging between adjacent pillars which, in turn, results in shorting (see, FIG. 1B). Also, although the pillars can be used in finer pitch applications, the solder wetting may require the pillars to be placed farther apart than desired. For this reason, it is not possible to provide a denser structure of connections.

SUMMARY

In an embodiment of the present invention, a semiconductor device fabrication method includes: forming a barrier layer upon a dielectric layer, forming a pillar interconnect structure upon the barrier layer, forming solder upon an upper surface of the pillar interconnect structure, reflowing the solder to release solder voids, subsequent to reflowing the solder, forming a perimeter material around at least a portion of an exposed sidewall of the pillar, and subsequent to forming the perimeter material, removing the barrier layer exterior to the pillar interconnect structure.

In another embodiment of the present invention, a semiconductor device fabrication method includes forming a barrier layer upon a dielectric layer, forming a pillar interconnect structure upon the barrier layer, forming solder upon an upper surface of the pillar interconnect structure, forming a perimeter material on exposed surfaces of the pillar interconnect structure, and subsequent to forming the perimeter material, removing the barrier layer on the surface of the dielectric layer exterior to the pillar interconnect structure.

In yet another embodiment of the present invention, a semiconductor device fabrication method includes forming a barrier layer upon a dielectric layer, forming a pillar interconnect structure upon the barrier layer wherein the pillar includes sidewalls, forming a wettable material on the pillar sidewalls, and subsequent to forming the wettable material, removing the barrier layer exterior to the pillar interconnect structure.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures or methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention generally relate to semiconductor devices, such as a semiconductor chip (chip) and more specifically relates to semiconductor structures and methods of manufacture and, more particularly, to pillar and solder ball interconnects for chip-to-package applications. More specifically, the embodiments of the present invention include pillar structures with non-wettable sidewall(s) and methods of manufacturing the same. In this way, the present invention improves device performance with a significant reduction in device shorting between connections, as well as allows denser pitch of interconnects to be formed on the device surface.

Referring now to the FIGs, wherein like components are labeled with like numerals, exemplary fabrication steps and corresponding structure in accordance with embodiments of the present invention are shown, and will now be described in greater detail below. It should be noted that some of the FIGs depict cross section views. Furthermore, it should be noted that while this description may refer to components in the singular tense, more than one component may be depicted throughout the figures or a real world implementation of the embodiments of the present invention. The specific number of components depicted in the figures and the cross section orientation was chosen to best illustrate the various embodiments described herein.

FIG. 2A-FIG. 2G show processes and respective structures in accordance with various embodiments of the invention. In particular, FIG. 2A a shows a beginning structure 5. The structure 5 includes a liner 10 such as, for example, Ti, Ti tungsten, or Ti tungsten chrome copper formed upon a dielectric layer 8, such as a semiconductor substrate. In embodiments, the liner 10 can be, for example, about 0.165 microns thick, but can range from about 0.125 to 0.205 microns in thickness, amongst other desirable dimensions. In embodiments, the liner 10 can act as an adhesion layer to the underlying dielectric layer 8, a barrier layer to prevent solder from penetrating the underlying materials or components.

Figure 2A:
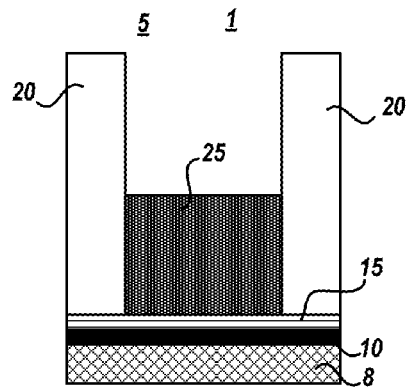
FIG. 2A-FIG. 2H depicts processes and respective contact and solder ball interconnect structures in accordance with various embodiments of the invention.

Still referring to FIG. 2A, a conductive layer 15 is formed upon the liner 10 using e.g. conventional processes. For example, the conductive layer 15 can be deposited using a sputtering technique or other known metal deposition techniques. In embodiments, the conductive layer 15 may be, for example, copper or other conductive materials such as, for example, nickel, nickel alloys, copper alloys, etc. The conductive layer 15 may be multilayered and also include a seed layer which may be, for example, Ti, Ti tungsten, or Ti tungsten chrome copper. The conductive layer 15 may be about 0.45 microns thick; although other dimensions are also contemplated by the present invention such as, for example, a range of about between 0.1 to 0.6 microns. In certain embodiments, conductive layer 15 is utilized as a shorting layer where electrical contact is made with a plating tool during plating operations.

A photoresist material 20 is deposited on the layer 15 using conventional deposition techniques such as, for example, dry film lamination or spin on liquid resist. The photoresist material 20 is then subjected to conventional lithographic and etching processes to form an opening or trench. Thereafter, a pillar 25 of copper, or copper alloy such as, for example, nickel, iron, cobalt, etc. is formed in the trench and in contact with the conductive layer 15. In embodiments, other metals can be used for the pillar 25 that show decreased wetting properties with solder such as, for example, cobalt. In various embodiments, pillar 25 is formed by plating operations. The copper or copper alloy pillar 25 may be about 40 microns in thickness; although other dimensions are also contemplated by the invention such as, for example, a range of about between 20 to 60 microns. In certain embodiments pillar 25 may be formed as a contact pad of less thickness than 20 to 60 microns, etc.

Figure 2B:
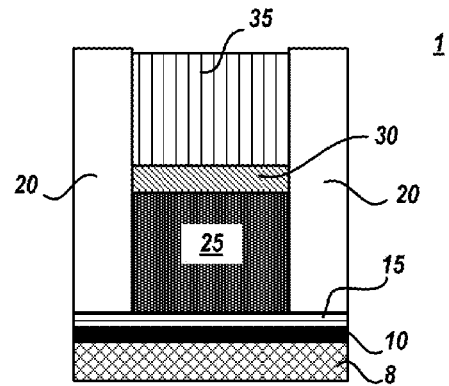

In FIG. 2B, a plate 30 may be formed on the pillar 25. More particularly, a metal plate 30 is deposited on the pillar 25 using, for example, another plating operation(s). In embodiments, the plate 30 provides a wettable surface for the solder. The metal plate 30 can be, for example, palladium, gold, or copper, for example, depending on the processes used to deposit the soldering. For example, in C4NP (C4 New Process) processes, the metal plate 30 can be either gold or copper (CU); whereas, in a solder plating technique, the metal plate is copper. In embodiments, the plate 30 may be subjected to a RIE process to clean the surface thereof. The copper layer can have an overall thickness in the range of about 0.2 microns to about 3 micron. The gold layer, on the other hand, can have a thickness in the range of about 0.01 microns to about 1.0 microns.

Further, solder 35 may be formed on the plate 30. More particularly, solder 35 is deposited on the plate 30 using, for example, another plating operation(s). In certain embodiments, solder 35 may be a tin-silver solder alloy solder, a tin-silver-copper alloy solder, etc. The solder 35 may be about 20 microns in thickness; although other dimensions are also contemplated by the invention such as, for example, a range of about between 2 to 30 microns.

Figure 2C:
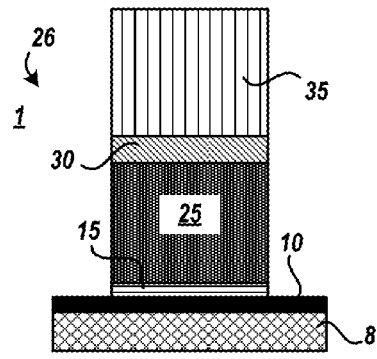

In FIG. 2C, the photoresist 20 is stripped using conventional strippers. For example, the photoresist 20 can be stripped using TMAH with a high pH content, with glycol to assist in swelling and NMP to aid in dissolution. Alternatively, the photoresist 20 can be stripped using sodium or potassium hydroxide. Also in FIG. 2C, portions of conductive layer 15 are stripped by, for example, utilizing photolithography and a wet etch, dry etch, or combination. In other embodiments, portions of conductive layer 15 may be removed by other known processes such as, for example, liquid or gas flux techniques. Generally, the portions of conductive layer 15 exterior to pillar 25 are removed.

Upon the removal of photoresist 20 and portions of conductive layer 15 a column structure 26 is formed and may include a retained portion of conductive layer 15, pillar 25, plate 30, and solder 35. The width/diameter of column structure 26 is generally similar to the width of the trench of photoresist 20. The column structure 26 shown in FIG. 2C may be formed by other known or additional techniques than those described without deviating from the spirit of those embodiments herein claimed.

Figure 1A:
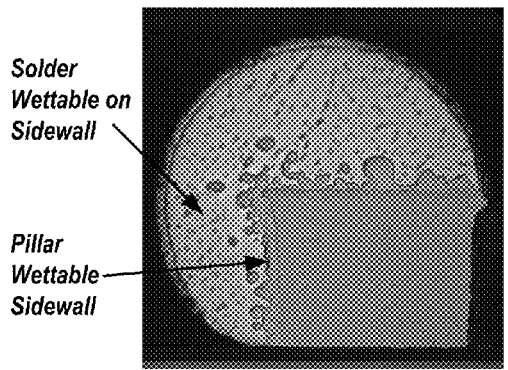
FIG. 1A and FIG. 1B depict copper pillar structure with wettable sidewalls.
Figure 1B:
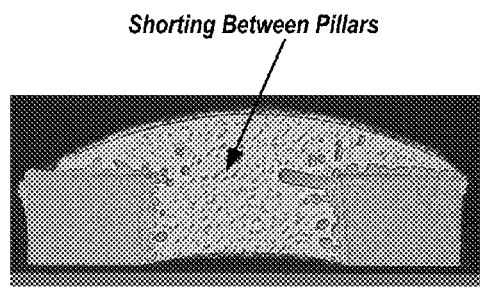
Figure 1C:
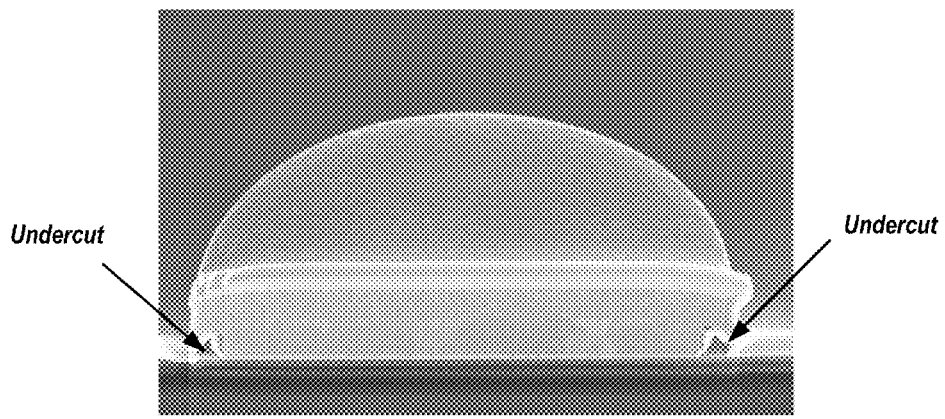
FIG. 1C depicts undercuts.
Figure 1D:
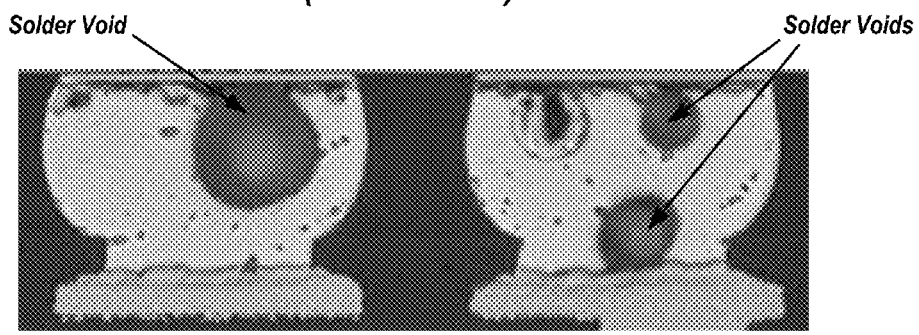
FIG. 1D depicts solder with solder voids.
Figure 2D:
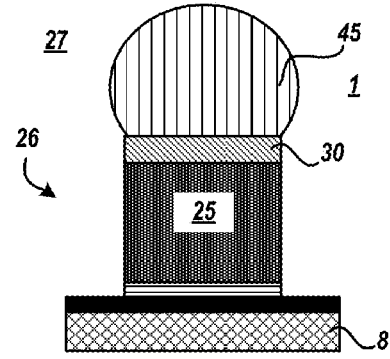

In FIG. 2D solder 35 is reflowed. The solder ball 45 may be, about 2 to 30 microns. During reflow, solder voids within solder 35 may escape and a resulting solder ball 45 may be wetted to an upper surface of plate 30. An exemplary depiction of solder voids is shown in FIG. 1D. Upon the reflow of solder 35, pillar-solder structure 27 is formed. In various embodiments, it is advantageous to reflow solder 35 prior to forming material upon solder 35 with an increased melting point. For example, if structure 26 undergoes an electroless plating operation a layer may be formed upon solder 35. If the solder 35 is not reflowed prior to the formation of such subset material thereupon, potential solder voids may not escape during a reflow since the solder voids may contact the added material losing velocity needed to move to an outer surface to escape.

The solder 35 reflow and wetting to plate 30 at the fabrication stage shown in FIG. 2D, is also known as a wafer level reflow. In certain embodiments, column structure 26 may undergo a pre-reflow bake to thicken the oxide on the Cu pillar 25 to limit potential pillar 25 sidewall wetting. Nonetheless, the likelihood of pillar 25 wetting occurring at this fabrication stage is low compared to potential wetting that occurs during chip-to-package assembly.

Figure 2E:
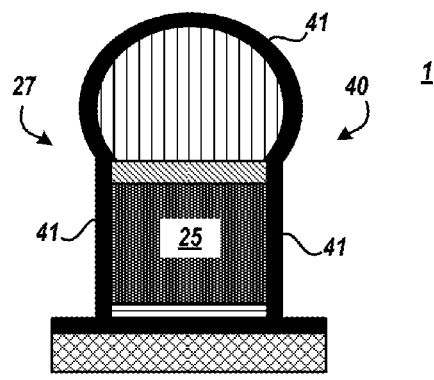

In FIG. 2E pillar-solder structure 27 may be electrolessly plated. For example, the pillar-solder structure 27 may be immersed in a Sn bath. The immersion bath plating operations form a Sn layer 40 on exposed surfaces (e.g. sidewalls of pillar 25 and solder ball 45, etc.). The Sn layer 40 may have a thickness ranging from about 0.01 um to about 1 um, although a thickness less than 0.01 um and greater than 1 um have been contemplated. In one embodiment, the Sn layer 40 may be about 0.1 to 0.3 um thick.

Pillar-solder structure 27 may be subjected to an oxygen or nitrogen environment (atmosphere) in order to modify the pillar 25 sidewall. More specifically, pillar-solder structure 27 can be placed in a furnace with an oxygen environment at about 150° C. for 10 minutes for each 0.1 um of Sn layer 40 thickness to form a $Cu_3Sn$ specie perimeter 41. The $Cu_3Sn$ specie perimeter 41 may have a thickness ranging from about 0.01 um to about 1 um, although a thickness less than 0.01 um and greater than 1 um have been contemplated. In one embodiment, the $Cu_3Sn$ specie perimeter 41 may be about 0.1 to 0.3 um thick. In certain embodiments, $Cu_3Sn$ specie perimeter 41 is formed upon the pillar 25 sidewalls, plate 30 sidewalls, and perimeter of solder ball 45.

In various embodiments, liner 10 protects underlying dielectric layer 8 from the plating processes of FIG. 2E, to for example, limit pillar undercuts. An exemplary depiction of pillar undercuts is shown in FIG. 1C. For example, the immersion electroless baths used in the plating process or pre-cursor acids used to remove, e.g., oxide will attack exposed dielectrics such as dielectric layer 8 or substrate. As such, maintaining liner 10 is advantageous to limit undesired dielectric damage while forming $Cu_3Sn$ specie perimeter 41.

In various embodiments, the $Cu_3Sn$ specie perimeter 41 does not react with solder which inhibits solder ball 45 from wetting the sides of at least the Cu pillar 25. The $Cu_3Sn$ specie perimeter 41 may be of such thickness and tenaciousness that it will withstand post processing (e.g. remains on the sidewall of the pillar 25). The $Cu_3Sn$ specie perimeter 41 may be formed by other known or additional techniques than those described without deviating from the spirit of those embodiments herein claimed.

Figure 2F:
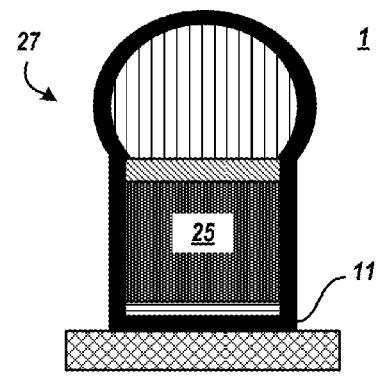

In FIG. 2F, portions of liner 10 are stripped by, for example, utilizing photolithography and a wet etch, dry etch, or combination. For example, a reactive ion etch (RIE) may be implemented to remove portions of liner 10. Generally, a pattern may be produced by applying a masking layer such as a photoresist to the surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. In other embodiments, portions of liner 10 may be removed by other known processes such as, for example, liquid or gas flux techniques. In various embodiments a portion 11 of liner 10 is retained. In certain embodiments, as is shown in FIG. 2F, the sidewalls of retained portion 11 of liner 10 are generally coplanar with the $Cu_3Sn$ specie perimeter 41. In other embodiments, the sidewalls of retained portion 11 of liner 10 are generally coplanar with the sidewalls of pillar 25. In certain embodiments, an argon/oxygen or nitrogen RIE ash may be performed to refresh the liner 10 (e.g. TiW, etc.) surface prior to etch.

Figure 2G:
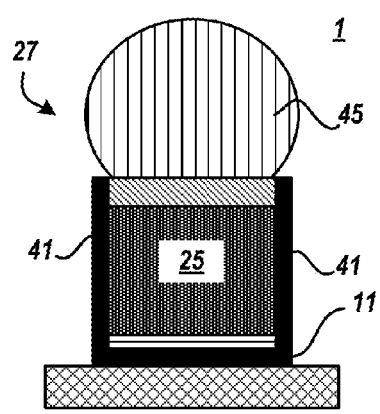

In FIG. 2G solder ball 45 is again reflowed to upper surface of plate 30. The solder ball 45 does not wet to the $Cu_3Sn$ specie perimeter 41 of at least the pillar 25 sidewalls and e.g. prevents shorting (e.g., bridging) between pillars, as well as allows reduced pitch (increased density) of the pillars, as they can now be placed closer together. During reflow, the $Cu_3Sn$ specie perimeter 41 material that was formed upon the perimeter of solder ball 45 may also reflow and become effectively integrated into solder ball 45. In various embodiments, the reflow as shown in FIG. 2G may be associated with a chip-to-package assembly wherein the solder ball 45 makes electrical contact with a second chip, package, or device.

Figure 2H:
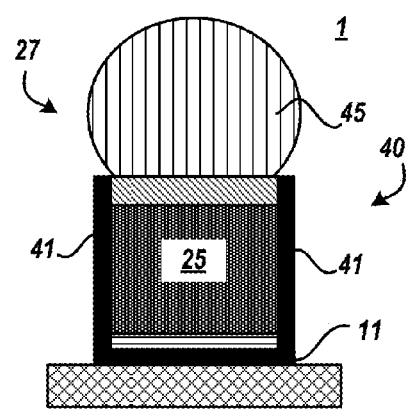

FIG. 2H depicts an alternative to FIG. 2E in that pillar-solder structure 27 may be selectively plated utilizing e.g. immersion plating techniques. For example, the pillar-solder structure 27 may be immersion plated to form Sn layer 40 on particular surfaces, e.g. sidewalls of pillar 25 and not upon other surfaces, e.g. solder ball 45, etc. The $Cu_3Sn$ specie perimeter 41 may be formed upon the selected surface, e.g. sidewalls of pillar 25, with similar techniques as described with reference to FIG. 2E.

FIG. 3A-FIG. 3D shows processes and respective structures in accordance with various embodiments of the invention. The embodiments of FIG. 3A-FIG. 3D depict embodiments wherein the pillar sidewalls are wettable.

Figure 3A:
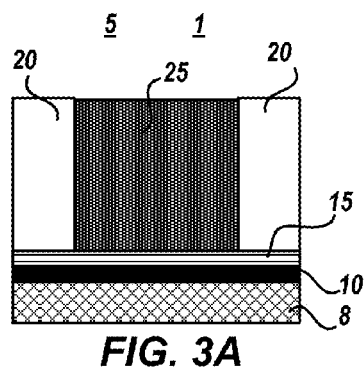
FIG. 3A-FIG. 3D depicts processes and respective contact and solder ball interconnect structures in accordance with various embodiments of the invention.

In particular, FIG. 3A a shows a structure 5 formed upon, for example, semiconductor wafer 1. The structure 5 includes liner 10 formed upon dielectric layer 8. Conductive layer 15 may be deposited on the liner 10. Photoresist material 20 is deposited on the layer 15. The photoresist material 20 is then subjected to conventional lithographic and etching processes to form a trench. Thereafter, a pillar 25 is formed in the opening and in contact with the underlying layer 15.

Figure 3B:
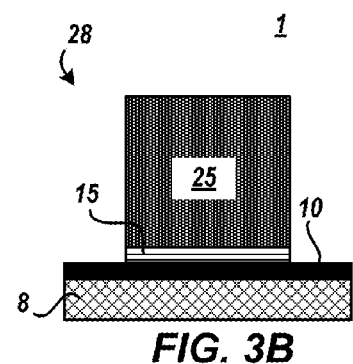

In FIG. 3B, photoresist 20 is stripped and portions of conductive layer 15 are removed using conventional techniques. Upon the removal of photoresist 20 and portions of conductive layer 15, column structure 28 is formed and includes a retained portion of conductive layer 15 and pillar 25. The column structure 28 shown in FIG. 3B may be formed by other known or additional techniques than those described without deviating from the spirit of those embodiments herein claimed.

Figure 3C:
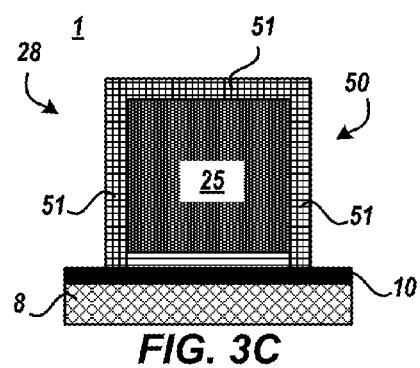

In FIG. 3C column structure 28 may be plated to form a layer of e.g. nickel preferably electroless nickel phosphorous (NiP) having about 6 to 15 weight % phosphorous. For example, column structure 28 may be immersed in an electroless NiP bath to deposit a NiP layer on column structure 28 perimeter sidewalls shown generally at reference numeral 50. In certain embodiments, the column structure 28 may be immersed in the NiP bath by immersing wafer 1. The immersion may be an electroless plating immersion. Further, the immersion may be a selective immersion such that the NiP layer 51 may be formed on selective surfaces (e.g. sidewalls of pillar 25, etc.). An exemplary plating process includes electroless plating of a NiP layer containing 8-10 wt. % phosphorus with a thickness of about 2-5 microns. The NiP electroless plating may be performed at a pH of about 4.8 to 5.3 at 82-85° C. for 20 minutes.

In certain embodiments a second wettable layer (not shown) may be formed, such as a layer of gold. For example, the structure of FIG. 3C may be immersed in an immersion Pd, Au, etc. bath to deposit a second wettable layer. In certain embodiments, the structure of FIG. 4C may be immersed in an Au bath by immersing wafer 1. The immersion may be an electroless plating immersion. Further, the immersion may be a selective immersion such that the second wettable layer may be formed on selective surfaces (e.g. sidewalls of layer 51, etc.). An exemplary gold plating process comprises electroless immersion plating of gold at a thickness of 0.03 to 0.13 micron. The gold immersion gold plating may be performed at a pH of 4.0-4.5 at 85° C. for 15 minutes. Electroless gold may be deposited at a pH of about 13.0-14.0 at 60° C. for 40 minutes.

Figure 3D:
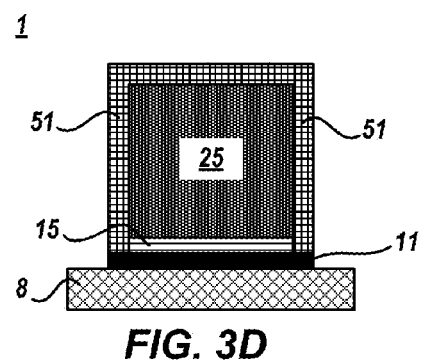

In FIG. 3D, portions of liner 10 are stripped by, for example, utilizing photolithography and a wet etch, dry etch, or combination. In various embodiments, liner 10 protects underlying dielectric layer 8 from the immersion processes of FIG. 3C, to for example, limit pillar undercuts. For example, the immersion electroless baths used in the plating process or pre-cursor acids will attack exposed dielectrics such as dielectric layer 8 or substrate. As such, maintaining liner 10 is advantageous to limit undesired dielectric damage while forming layer 51 and/or the second wettable layer. In various embodiments a portion 11 of liner 10 is retained. In certain embodiments, the sidewalls of retained portion 11 of liner 10 are generally coplanar with the perimeter of layer 51 sidewalls (if the second wettable layer is not formed) or the second wettable layer sidewalls. In other embodiments, the sidewalls of retained portion 11 of liner 10 are generally coplanar with the sidewalls of pillar 25.

In certain embodiments, the structures shown in FIG. 3A-FIG. 3D may be utilized in chip-to-package application where connection solder is located on the package as opposed to the chip.

Figure 4:
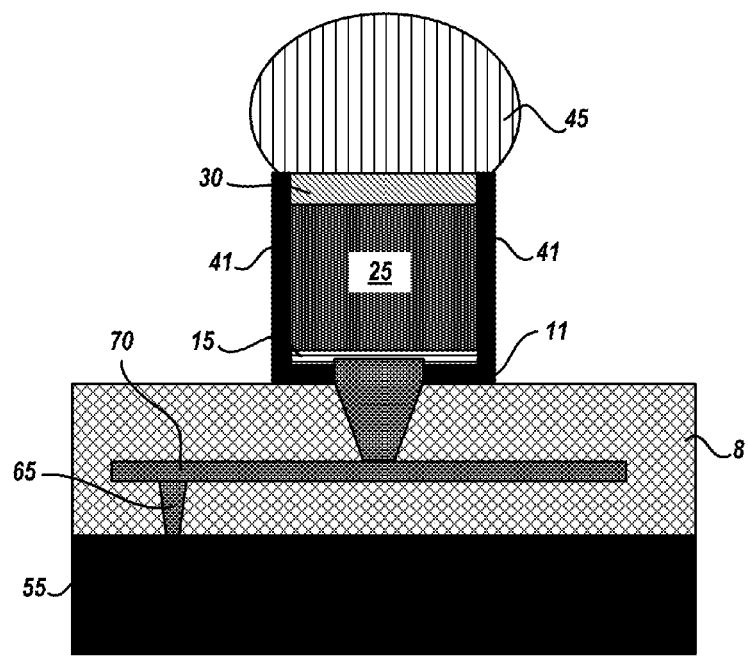
FIG. 4 depicts a semiconductor device structure in accordance with aspects of the invention.

FIG. 4 shows a structure implementing a pillar structure and processes of the present invention. Although FIG. 4 shows a single pillar structure, it should be understood by those of skill in the art that a plurality of pillar structures can be formed on the surface of the structure using the fabrication processes above. In the example of FIG. 4, one or more dielectric layers 8 are formed on a substrate 55. The substrate 55 may be, for example, silicon or other known substrates for semiconductor devices. A metal interconnect 65 and connecting metal line 70 are formed in the one or more dielectric layers 8 using conventional damascene and deposition processes. A via is formed in an upper portion of the dielectric layers 8, in which the liner 10 is formed thereon (portion 11 is subsequently retained, etc.). In embodiments, liner 10 is in contact with the underlying wiring metal 70. The liner 10 is also deposited on the top surface of the dielectric layers 8. The plate 15 is deposited on the liner 10, and within or contacting the via. The pillar 25 and modified sidewall 41 is formed in accordance with the various embodiments as described herein. The plate 30 is formed, depending on the processes used for solder wetting, e.g., plating or C4NP processing. The solder ball 45 is flowed onto the structure.

Figure 5:
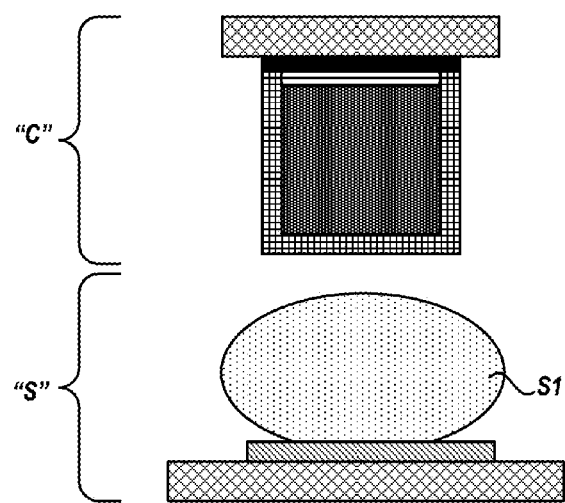
FIG. 5 depicts a semiconductor chip-to-package interconnect structure in accordance with embodiments of the invention.

In embodiments of the invention, the solder may be connected to a carrier or package substrate. For example, solder can be applied to the package substrate in almost all instances, with the exception of some ceramic carriers. It is contemplated that the solder can come from the pillars comprised within a chip (e.g. see FIG. 2G) or from the package substrate. In embodiments, the pillar can be completely devoid of any solder and still be joined to the package substrate. By way of example, FIG. 5 shows a chip "C" and a package substrate "S". Solder "S1" is provided on the package substrate S for joining the chip "C" and package substrate "S". As noted above, the pillar of the chip does not need solder, as it can connect to the package substrate with the solder 51 on the substrate S.

Figure 6:
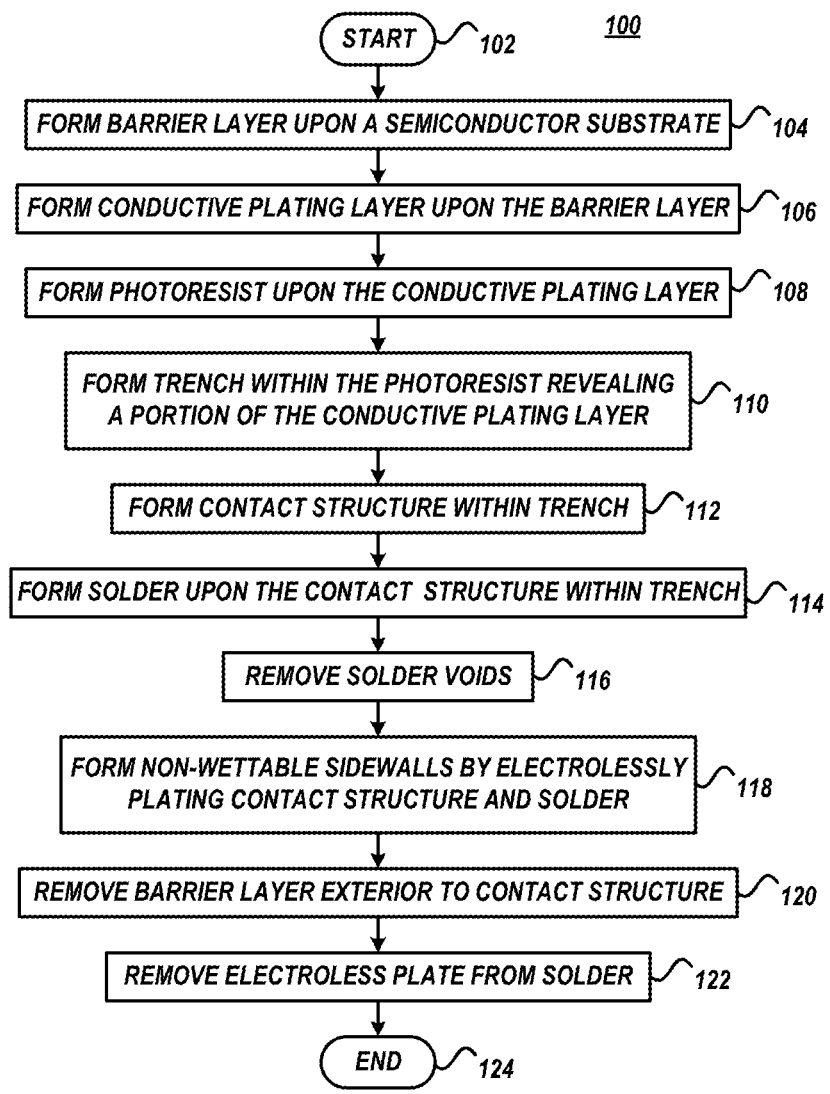
FIG. 6-FIG. 8 depict exemplary semiconductor device fabrication process flow methods, in accordance with various embodiments of the present invention.

FIG. 6 depicts an exemplary semiconductor device fabrication process flow method 100, in accordance with various embodiments of the present invention. Method 100 may be utilized in implementations where it may be beneficial to reduce to the wetting properties of the pillar to prevent the solder from wetting to the pillar sidewall. For example, in certain applications such as fine pitch interconnect applications, it may be beneficial to prevent solder wetting because such wetting may reduce standoff and limit underfill flow that can sometimes lead to solder bridging.

Method 100 begins at block 102 by forming a barrier layer being upon a dielectric such as a semiconductor substrate (block 104). More particularly, liner 10 may be formed on dielectric layer 8. Method 100 may continue by forming a conductive plating layer upon the barrier layer (block 106). More particularly conductive layer 15 may be formed upon liner 10. Method 100 may continue by forming a photoresist upon the conductive plating layer (block 108). More particularly, photoresist material 20 may be deposited on conductive layer 15.

Method 100 may continue by subjecting photoresist material to conventional lithographic and etching processes to form a trench revealing a portion of the conductive plating layer (block 110). Thereafter, method 100 may continue by forming a contact structure within the trench (block 112). For example, a pillar 25 (or other contact structure such as a pad, etc.) is formed in the trench and in contact with the conductive plating layer with an electrodeposition plating technique. In certain embodiments, plate 30 is formed on the pillar 25 within the trench with e.g. another electrodeposistion plating process.

Method 100 may continue with forming solder upon the contact structure within the trench (block 114). For example, solder 35 may be formed upon pillar 25, upon plate 30, etc. with another electrodeposistion plating operation. In various embodiments, the photoresist and portions of conductive plating layer exterior to the contact structure are stripped. For example, sidewalls of the conductive layer 15 may be coplanar with sidewalls of pillar 25.

Method 100 may continue by reflowing the solder to remove solder voids (block 116). For example, solder 35 is reflowed such that solder voids within solder 35 escape. It may be advantageous to reflow solder 35 prior to subsequent plating operations that deposit additional material upon solder 35 since potential solder voids may become trapped by the additional layer. In certain embodiments, the contact structure may undergo a pre-reflow bake to thicken the oxide on the contact structure to limit potential sidewall wetting during the solder void reflow of block 108. The probability of sidewall wetting occurring at block 108 is low compared to sidewall wetting occurring during chip-to-package assembly.

Method 100 may continue with forming non-wettable contract structure sidewalls by electrolessly plating the contact structure and solder (block 118). For example, the contact structure and solder may be immersed in an electroless Sn bath to deposit a Sn layer on the exposed contact structure sidewalls and solder exterior. The structure may heated in a furnace with an oxygen environment at about 150° C. for 10 minutes for each 0.1 um of Sn layer thickness forming a non-wettable $Cu_3Sn$ specie perimeter upon exposed contact structure sidewalls and solder exterior. In various embodiments, the barrier layer protects the underlying dielectric from the plating processes of block 110 to for example, limit pillar undercuts. As such, maintaining the barrier layer is advantageous to limit undesired dielectric damage while forming non-wettable sidewalls.

Method 100 may continue with removing the barrier layer exterior to the contact structure (block 120). For example, portions of liner 10 are stripped by, for example, utilizing photolithography and a wet etch, dry etch, or combination. In various embodiments a portion 11 of liner 10 is retained and may effectively become part of the pillar structure. In certain embodiments, the sidewalls of retained portion 11 of liner 10 are generally coplanar with the non-wettable sidewall perimeter 41. In other embodiments, the sidewalls of retained portion 11 of liner 10 are generally coplanar with the sidewalls of e.g. pillar 25. In certain embodiments, an argon/oxygen or nitrogen RIE ash may be performed to refresh the liner 10 (e.g. TiW, etc.) surface prior to etch.

Method 100 may continue with reflowing the plated solder (block 122). The solder may be reflowed to pull together or integrate the material of the solder and the deposited plating material. For example, solder 45 may be reflowed and re-wetted to upper surface of plate 30. The solder ball 45 does not wet to the non-wettable perimeter of the contact structure. This prevents shorting (e.g., bridging) between pillars, as well as allows reduced pitch (increased density) of the pillars, as they can now be placed closer together. During reflow, the plated material formed upon the perimeter of solder ball 45 may also reflow and become effectively integrated into solder ball 45. In various embodiments, the reflow of block 122 may be associated with a chip-to-package assembly wherein the solder ball 45 makes electrical contact with a second chip, package, or device. Method 100 ends at block 124.

Figure 7:
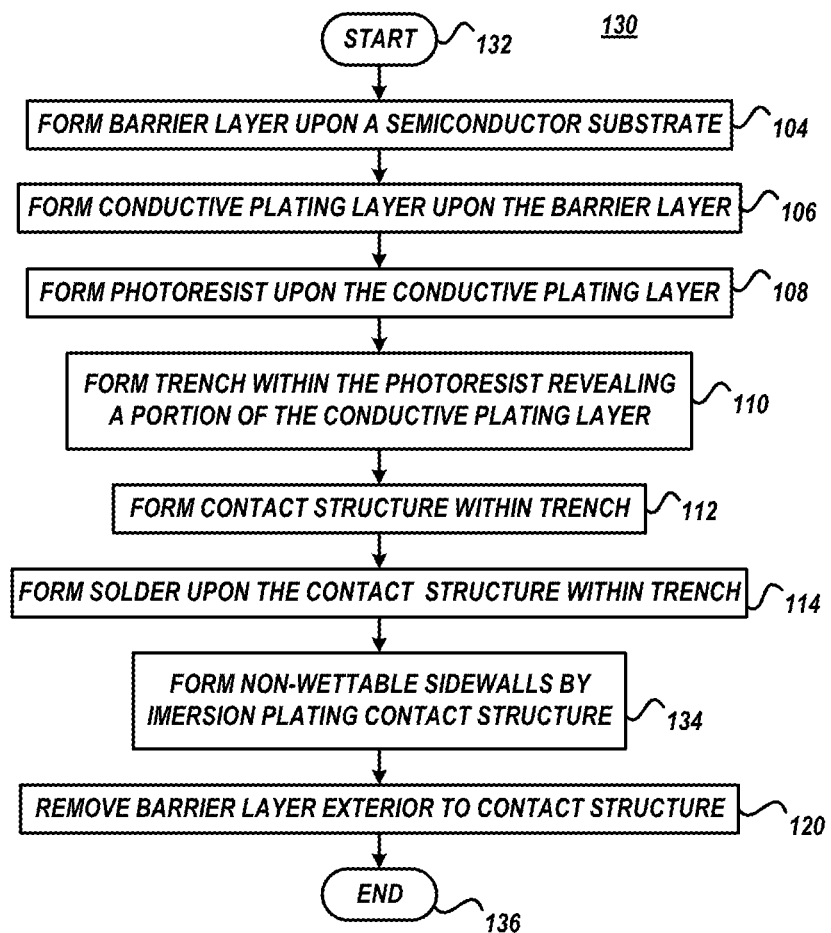

FIG. 7 depicts an exemplary semiconductor device fabrication process flow method 130, in accordance with various embodiments of the present invention. Method 130 begins at block 132 and continues with forming a barrier layer being upon a dielectric such as a semiconductor substrate (block 104), forming a conductive plating layer upon the barrier layer (block 106), forming a photoresist upon the conductive plating layer (block 108), forming a trench within the photoresist revealing a portion of the conductive plating layer (block 110), forming a contact structure within the trench (block 112), and forming solder upon the contact structure within the trench (block 114).

Method 130 may continue with forming non-wettable contract structure sidewalls by immersion plating the contact structure (block 134). For example, the contact structure may be selectively immersion plated to deposit a Sn layer on the exposed contact structure sidewalls and to not deposit a Sn layer upon the solder. The structure may heated in a furnace with an oxygen environment at about 150° C. for 10 minutes for each 0.1 um of Sn layer thickness forming a non-wettable $Cu_3Sn$ specie perimeter upon exposed contact structure sidewalls. In various embodiments, the barrier layer protects the underlying dielectric from the plating processes of block 134 to for example, limit pillar undercuts. As such, maintaining the barrier layer is advantageous to limit undesired dielectric damage while forming non-wettable sidewalls. Method 130 may continue with removing the barrier layer exterior to the contact structure (block 120) and ends at block 136.

Figure 8:
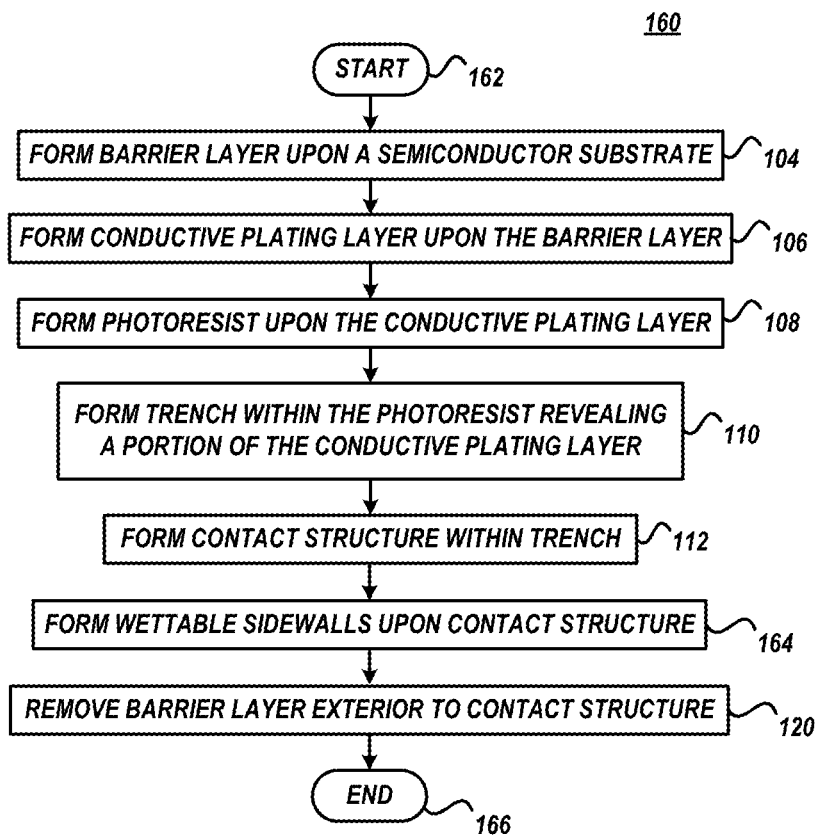

FIG. 8 depicts an exemplary semiconductor device fabrication process flow method 160, in accordance with various embodiments of the present invention. Method 160 begins at block 162 and continues with forming a barrier layer being upon a dielectric such as a semiconductor substrate (block 104), forming a conductive plating layer upon the barrier layer (block 106), forming a photoresist upon the conductive plating layer (block 108), forming a trench within the photoresist revealing a portion of the conductive plating layer (block 110), and forming a contact structure within the trench (block 112).

Method 160 may continue with forming wettable sidewalls of contact structure (block 164). For example, as shown in FIG. 3C contact structure (e.g. column structure 28) may be plated to form a layer of e.g. nickel preferably electroless nickel phosphorous (NiP) having about 6 to 15 weight % phosphorous. For example, column structure 28 may be immersed in an immersion NiP bath to deposit a NiP layer on column structure 28 perimeter sidewalls shown generally at reference numeral 50. In certain embodiments, the column structure 28 may be immersed in the NiP bath by immersing wafer 1. The immersion may be an electroless plating immersion. Further, the immersion may be a selective immersion such that the NiP layer 50 may be formed on selective surfaces (e.g. sidewalls of pillar 25, etc.). An exemplary plating process includes electroless plating of a NiP layer containing 8-10 wt. % phosphorus with a thickness of about 2-5 microns. The NiP electroless plating may be performed at a pH of about 4.8 to 5.3 at 82-85° C. for 20 minutes. In certain embodiments, the structure of FIG. 3C may be again plated to form a second wettable layer (not shown), such as a layer of gold. An exemplary gold plating process comprises electroless immersion plating of gold at a thickness of 0.03 to 0.13 micron. The gold immersion gold plating may be performed at a pH of 4.0-4.5 at 85° C. for 15 minutes. Electroless gold may be deposited at a pH of about 13.0-14.0 at 60° C. for 40 minutes. In this manner the NiP layer 50 forms wettable sidewalls upon the contact structure. Method 160 may continue with removing the barrier layer exterior to the pillar structure (block 120) and may end at block 166.

Figure 9:
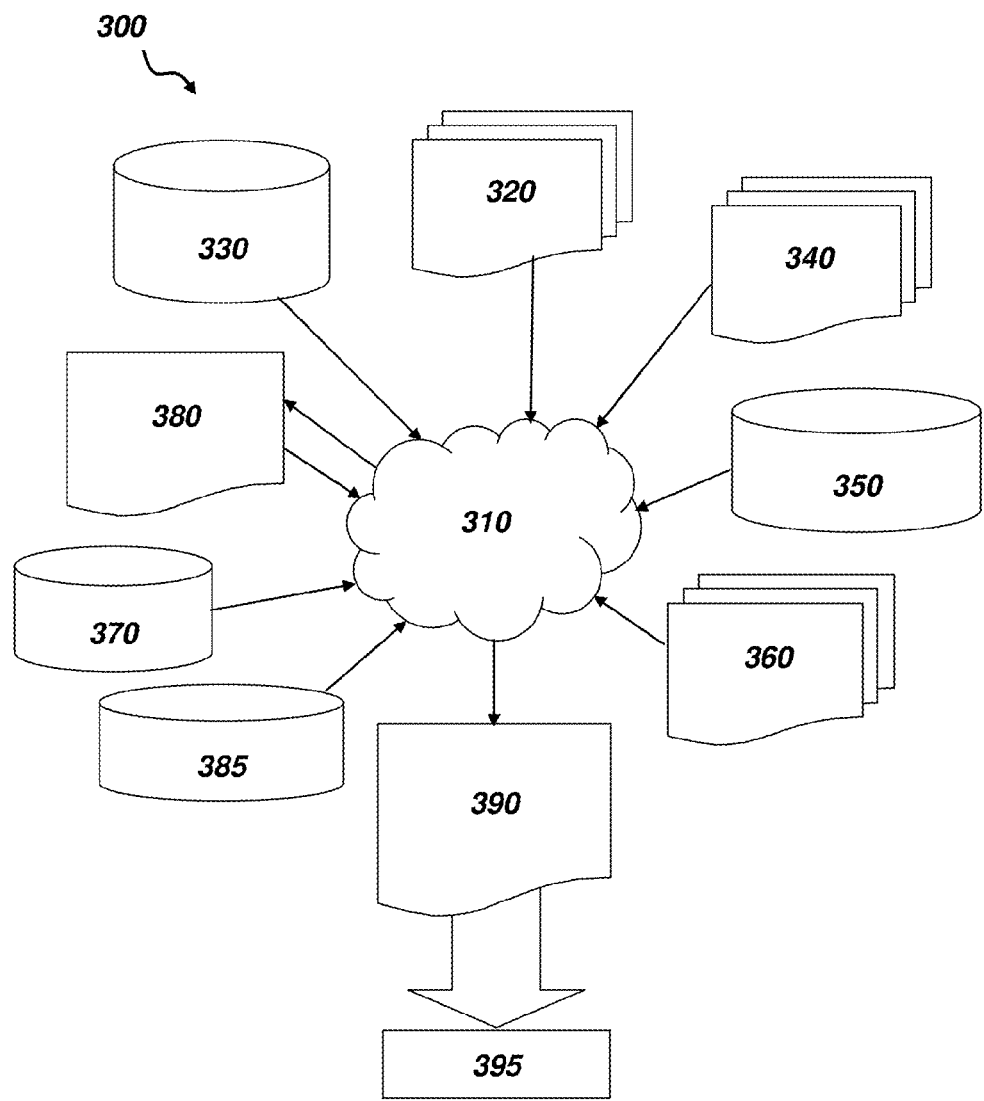
FIG. 9 depicts a flow diagram of a design process used in semiconductor device design, manufacture, and/or test, in accordance with various embodiments of the present invention.

Referring now to FIG. 9, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIGS. 2-5.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIGS. 2-5. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIGS. 2-5. to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-5. In one embodiment, design structure 390 may comprise a compiled, executable HDL simulation model that functionally simulates the devices shown in FIGS. 2-5.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-5. Design structure 390 may then proceed to a stage 395 where, for example, design structure 390: proceeds to tape-out, is released to manufacturing, is released to a mask house, is sent to another design house, is sent back to the customer, etc.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a carrier, with leads that are affixed to a motherboard or other higher level carrier) or in a multichip package (e.g., a carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

References herein to terms such as "vertical", "horizontal", etc. are made by way of example, and not by way of limitation, to establish a frame of reference. The term "horizontal" as used herein is defined as a plane parallel to the conventional plane or surface of the substrate, regardless of the actual spatial orientation of the semiconductor substrate. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A semiconductor device fabrication method comprising:
    forming a barrier layer upon a dielectric layer;
    forming a pillar interconnect structure upon the barrier layer;
    forming solder upon an upper surface of the pillar interconnect structure;
    reflowing the solder to release solder voids;
    subsequent to reflowing the solder, plating a perimeter metal material around at least a portion of an exposed sidewall of the pillar interconnect structure, and;
    subsequent to plating the perimeter material, removing the barrier layer exterior to the pillar interconnect structure.

2. The semiconductor device fabrication method of claim 1, wherein the perimeter metal material forms non-wetting pillar structure sidewalls.

3. The semiconductor device fabrication method of claim 1, wherein forming the pillar interconnect structure upon the barrier layer comprises:
    forming a conductive layer upon the barrier layer;
    forming a photoresist upon the conductive layer;
    forming an opening in the photoresist layer, the opening exposing a portion of the conductive layer;
    forming a pillar in the opening in contact with the conductive layer;
    forming a contact plate on the pillar within the opening, and;
    removing the photoresist and portions of conductive layer exterior to the pillar, such that sidewalls of the conductive layer are coplanar with sidewalls of pillar.

4. The semiconductor device fabrication method of claim 3, wherein the solder is wetted to an upper surface of the contact plate.

5. The semiconductor device fabrication method of claim 1, wherein plating the perimeter metal material comprises:
    electrolessly plating a Tin layer on the solder and pillar interconnect structure perimeter;
    forming a Copper Tin perimeter metal material upon the solder and pillar interconnect structure perimeter from the Tin layer.

6. The semiconductor device fabrication method of claim 5, further comprising:
    reflowing the plated solder to integrate the material of the solder and the Copper Tin perimeter metal material upon the solder.

7. The semiconductor device fabrication method of claim 5, wherein forming the Copper Tin perimeter metal material and solder and pillar interconnect structure perimeter comprises:
    forming pillar interconnect structure sidewalls that do not react with the solder to inhibit the solder ball from wetting to the pillar interconnect structure sidewalls.

8. The semiconductor device fabrication method of claim 1, wherein the barrier layer is retained during the plating of the solder and pillar interconnect structure to protect the dielectric layer.

9. The semiconductor device fabrication method of claim 3, wherein removing the barrier layer exterior to the pillar structure comprises:
    removing the barrier layer exterior to the pillar interconnect structure such that sidewalls of the barrier layer are coplanar with sidewalls of the pillar interconnect structure.

10. The semiconductor device fabrication method of claim 5, wherein removing the barrier layer exterior to the pillar interconnect structure comprises:
    removing the barrier layer exterior to the pillar interconnect structure such that sidewalls of the barrier layer are coplanar with the Copper Tin perimeter metal material.

11. The semiconductor device fabrication method of claim 3, wherein the reflow of the plated solder is associated with a semiconductor chip-to-package interconnection process.

12. A semiconductor device fabrication method comprising:
    forming a barrier layer upon a dielectric layer;
    forming a pillar interconnect structure upon the barrier layer;
    forming solder upon an upper surface of the pillar interconnect structure;
    plating a perimeter metal material on exposed surfaces of the pillar interconnect structure, and;
    subsequent to plating the perimeter metal material, removing the barrier layer on the surface of the dielectric layer exterior to the pillar interconnect structure.

13. The semiconductor device fabrication method of claim 12, wherein the perimeter metal material forms non-wetting pillar interconnect structure sidewalls.

14. The semiconductor device fabrication method of claim 12, wherein forming the pillar interconnect structure upon the barrier layer comprises:
    forming a conductive layer upon the barrier layer;
    forming a photoresist upon the conductive layer;
    forming an opening in the photoresist layer, the opening exposing a portion of the conductive layer;
    forming a pillar in the opening in contact with the conductive layer;
    forming a contact plate on the pillar within the opening, and;
    removing the photoresist and portions of conductive layer exterior to the pillar, such that sidewalls of the conductive layer are coplanar with sidewalls of pillar.

15. The semiconductor device fabrication method of claim 14, wherein the solder is wetted to an upper surface of the contact plate.

16. The semiconductor device fabrication method of claim 12, wherein plating the perimeter metal material comprises:
    immersion plating a Tin layer on exposed surfaces of the pillar interconnect structure perimeter;
    forming a Copper Tin perimeter metal material upon the pillar interconnect structure perimeter from the Tin layer.

17. The semiconductor device fabrication method of claim 16, wherein forming the Copper Tin metal material pillar interconnect structure perimeter comprises:
    forming pillar interconnect structure sidewalls that do not react with the solder to inhibit the solder from wetting to the pillar interconnect structure sidewalls.

18. The semiconductor device fabrication method of claim 16, wherein the barrier layer is retained during the immersion plating of the pillar interconnect structure to protect the dielectric layer.

19. The semiconductor device fabrication method of claim 16, wherein removing the barrier layer exterior to the pillar structure comprises:
    removing the barrier layer exterior to the pillar interconnect structure such that sidewalls of the barrier layer are coplanar with the Copper Tin metal material perimeter.

20. A semiconductor device fabrication method comprising:
- forming a barrier layer upon a dielectric layer;
- forming a pillar interconnect structure upon the barrier layer, wherein the pillar interconnect structure comprises sidewalls;
- plating a wettable material on the pillar interconnect structure sidewalls, and;
- subsequent to plating the wettable material, removing the barrier layer exterior to the pillar interconnect structure.

* * * * *